United States Patent
Nakayama et al.

(10) Patent No.: US 9,076,960 B2
(45) Date of Patent: Jul. 7, 2015

(54) MAGNETIC MEMORY ELEMENT

(71) Applicant: KABUSHIKI KAISHA TOSHIBA, Tokyo (JP)

(72) Inventors: Masahiko Nakayama, Yamaguchi (JP); Tatsuya Kishi, Kanagawa (JP); Masaru Toko, Tokyo (JP); Akiyuki Murayama, Fukuoka (JP); Yutaka Hashimoto, Chiba (JP); Hisanori Aikawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/017,237

(22) Filed: Sep. 3, 2013

(65) Prior Publication Data
US 2014/0264669 A1  Sep. 18, 2014

(30) Foreign Application Priority Data
Mar. 14, 2013  (JP) ................. 2013-052170

(51) Int. Cl.
*H01L 43/00* (2006.01)
*H01L 43/10* (2006.01)
*H01L 43/08* (2006.01)

(52) U.S. Cl.
CPC ............... *H01L 43/10* (2013.01); *H01L 43/08* (2013.01)

(58) Field of Classification Search
CPC ................................. H01L 43/08; H01L 43/10
USPC .......... 257/723, 734, 784, 678, 685–686, 421
See application file for complete search history.

(56) References Cited

U.S. PATENT DOCUMENTS

2013/0221459 A1* 8/2013 Jan et al. ................. 257/421

* cited by examiner

*Primary Examiner* — Thanh T Nguyen
(74) *Attorney, Agent, or Firm* — Patterson & Sheridan, LLP

(57) ABSTRACT

A magnetic memory element includes a memory layer having magnetic anisotropy on the film surface thereof in the perpendicular direction and in which the magnetization direction is variable, a reference layer having magnetic anisotropy on the film surface thereof in the perpendicular direction and in which the magnetization direction is not variable, and a tunnel barrier layer which is interposed between the memory layer and the reference layer. The memory layer is made of an alloy including cobalt (Co) and iron (Fe). A plurality of oxygen atoms are present on both interfaces of the memory layer.

18 Claims, 5 Drawing Sheets

LOWER RESISTANCE STATE

HIGH RESISTANCE STATE

US 9,076,960 B2

MAGNETIC MEMORY ELEMENT

CROSS-REFERENCE TO RELATED APPLICATION

This application is based upon and claims the benefit of priority from Japanese Patent Application No. 2013-052170, filed Mar. 14, 2013, the entire contents of which are incorporated herein by reference.

FIELD

Embodiments described herein relate generally to a magnetic memory element.

BACKGROUND

A Magnetic Random Access Memory (MRAM) includes a Magnetic Tunnel Junction (MTJ) element which according to a magneto-resistive effect has a resistance value that is variable due to magnetized states of two magnetic layers that are used as memory elements.

In order to make the MRAM practical, it is necessary to increase its capacity, and to reduce a chip size thereof. In order to realize such goals, it is preferable to further minimize memory cell array size, that is, to further minimize the size of the MTJ element.

In order for the MTJ element to stably retain information for a long period of time, its magnetic layer should have a predetermined thermal disturbance constant. Accordingly, even when the size of the MTJ element is minimized, it is necessary to secure a sufficient thermal disturbance constant.

DETAILED DESCRIPTION

Figure 1:
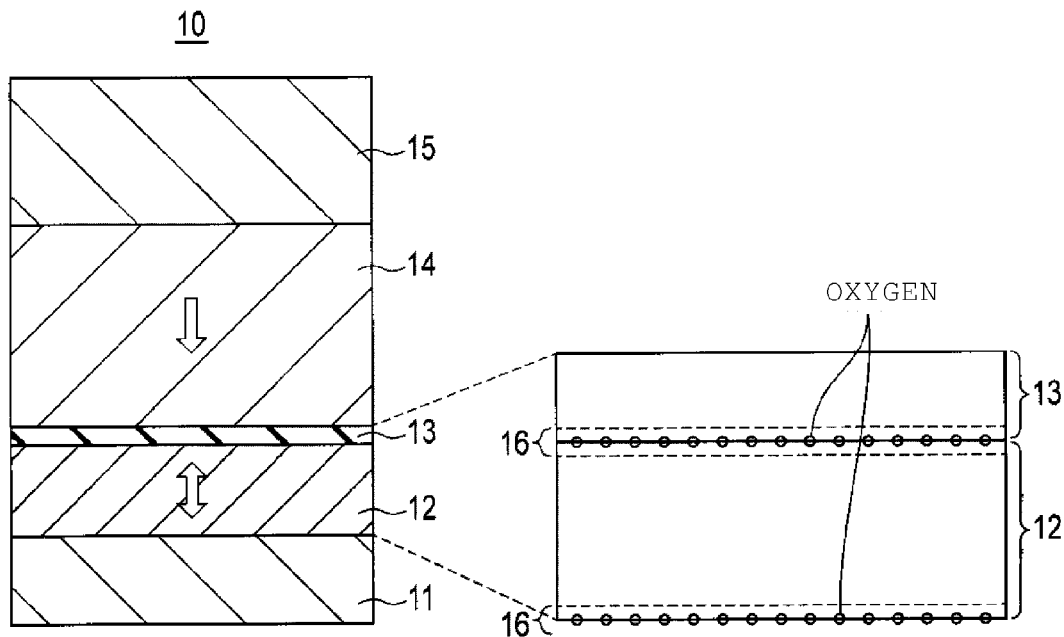
FIG. 1 is a cross-sectional view of an MTJ element according to a first embodiment.

In general, according to an embodiment, there is provided a magnetic memory element which is able to secure a sufficient thermal disturbance constant for maintaining information for a long period of time, even when the size of a magnetic layer is minimized.

The magnetic memory element according to the embodiments includes a memory layer which includes magnetic anisotropy on the film surface in a perpendicular direction, and in which a magnetization direction is variable; a reference layer which includes magnetic anisotropy on the film surface in the perpendicular direction, and in which the magnetization direction is not variable; and a tunnel barrier layer which is interposed between the memory layer and the reference layer, in which the memory layer is made of an alloy including cobalt (Co) and iron (Fe), and a plurality of oxygen atoms are present on an interface between the tunnel barrier layer and the memory layer, and on a main surface of the memory layer which is opposite to the tunnel barrier layer.

Hereinafter, embodiments will be described with reference to drawings. However, the drawings are schematic and conceptual; accordingly, dimensions, ratios, or the like of each drawing may not necessarily be the same as those in the actual element. Some embodiments which will be described below are examples of a device and method for embodying technical ideas of exemplary embodiments, and the technical ideas of exemplary embodiments are not limited to the specific shape, a structure, arrangement or the like of constituent components. In addition, in the following descriptions, elements having the same function and configuration will be given the same reference numerals, and repeated descriptions will be made only as necessary.

First Embodiment

FIG. 1 is a cross-sectional view of an MTJ element (magnetic memory element) 10 according to a first embodiment. The MTJ element 10 is laminated with a base layer 11, a memory layer 12, a non-magnetic layer (tunnel barrier layer) 13, a reference layer 14, and a hard mask layer 15. In addition, the memory layer 12 and the reference layer 14 can be reversed. Arrows in the figure denote magnetization states. The MTJ element 10 is not limited to a planar shape, and may be a circle, or an oval, for example.

The memory layer 12 and the reference layer 14 have magnetic anisotropy on the film surface along the perpendicular direction thereof, and magnetization directions thereof are perpendicular to the film surface. That is, the MTJ element 10 is a perpendicular magnetized MTJ element in which the magnetization directions of the memory layer 12 and the reference layer 14 are oriented in the perpendicular direction with respect to the film surface, respectively.

The magnetization direction of the memory layer 12 is variable (reversible). The magnetization direction of the reference layer 14 is not variable (fixed). The reference layer 14 is designed so as to have a perpendicular magnetic anisotropy energy which is sufficiently larger than that of the memory layer 12. Setting of the magnetic anisotropy can be made by adjusting a material composition, or film thickness. In this manner, a magnetization reversal current of the memory layer 12 is set to be small, and a magnetization reversal current of the reference layer 14 is set to be larger than that of the memory layer 12. In this manner, it is possible to realize the MTJ element 10 including the memory layer 12 of which the magnetization direction is variable, and the reference layer 14 of which the magnetization direction is not variable with respect to a predetermined write current.

The tunnel barrier layer 13 is configured with a non-magnetic material, and it is possible to use non-magnetic metal, a semiconductor, an insulating material, or the like. As the tunnel barrier layer 13, for example, magnesium oxide (MgO) is used.

The base layer 11 is configured with non-magnetic metal, for example, and is provided in order to control crystalline orientation of the memory layer 12. The hard mask layer 15 is configured with metal, for example, and is used as a mask when processing the MTJ element 10. The hard mask layer 15 may be configured so as to function as an upper electrode. As the hard mask layer 15, it is possible to use tantalum (Ta), or the like.

Magnetic anisotropy energy Ku of the magnetic layer may be determined according to the following expression.

$$Ku = Ks \cdot S - 2\pi Ms^2 (3Na - \frac{1}{2})$$

Here, Ks is an interface magnetic anisotropy constant, S is an area of the magnetic layer, Ms is saturation magnetization, and Na is a demagnetizing factor. From the above expression, it is possible to understand that, when the area S of the magnetic layer becomes small, the magnetic anisotropy energy Ku becomes small.

The thermal disturbance constant of the magnetic layer is expressed as "$Ku/(K_B \cdot T)$". $K_B$ is Boltzmann's constant, and T is a temperature. Accordingly, it is understood that, when the magnetic anisotropy energy Ku of the magnetic layer becomes small, the thermal disturbance constant of the magnetic layer becomes small. When the thermal disturbance constant of the magnetic layer becomes small, it is not easy for the magnetic layer to maintain the magnetized state, that is, it is not easy for the MTJ element 10 to retain information. Accordingly, it is important to make the magnetic anisotropy energy of the memory layer 12 large, in order to secure a sufficient thermal disturbance constant even when the size of the MTJ element 10 is minimized.

According to the embodiment, the memory layer 12 is configured with an alloy including cobalt (Co) and iron (Fe), for example, CoFeB, and the tunnel barrier layer 13 is configured of an oxide, for example, magnesium oxide (MgO). At this time, symmetry of d electron orbitals of cobalt (Co) and iron (Fe) collapses, when p orbitals of cobalt (Co) and iron (Fe), and oxygen are coupled, and as a result, it is considered that perpendicular magnetic anisotropy is induced in the memory layer 12.

Therefore, according to the embodiment, a plurality of oxygen atoms (O) are inserted into both of the interfaces of the memory layer 12 (or magnetic layer which is included in memory layer 12), respectively. In addition, the perpendicular magnetic anisotropy energy of the memory layer is increased by inducing the perpendicular magnetic anisotropy from both the interfaces of the memory layer 12.

A diagram on the right side in FIG. 1 is an enlarged view of the memory layer 12 and the tunnel barrier layer 13. As illustrated in FIG. 1, a plurality of oxygen atoms (O) are inserted into both of the interfaces of the memory layer 12 (interface between memory layer 12 and tunnel barrier layer 13, and interface between memory layer 12 and base layer 11). The memory layer 12 is configured with the alloy including cobalt (Co) and iron (Fe), for example, CoFeB. In addition, when the tunnel barrier layer 13 is configured with an oxide, since the oxygen atoms configuring the tunnel barrier layer 13 are present on the interface between the memory layer 12 and the tunnel barrier layer 13, it is not necessary to newly insert oxygen atoms into the interface between the memory layer 12 and the tunnel barrier layer 13. On the other hand, the tunnel barrier layer 13 may be configured with a non-magnetic material other than oxide. In such a case, since the tunnel barrier layer 13 does not include a plurality of oxygen atoms, a plurality of oxygen atoms are inserted into the interface between the memory layer 12 and the tunnel barrier layer 13.

The base layer 11 may be configured with a non-magnetic layer including oxygen atoms. In this case, since oxygen atoms configuring the base layer 11 are present on the interface between the memory layer 12 and the base layer 11, it is not necessary to newly insert oxygen atoms into the interface between the memory layer 12 and the base layer 11.

When the configuration in FIG. 1 is expressed in other words, a layer 16 including oxygen atoms is provided on the interface between the memory layer 12 and the tunnel barrier layer 13, and the interface between the memory layer 12 and the base layer 11, respectively. The layer 16 including oxygen atoms is configured with CoFeB and oxygen atoms which are main components.

Figure 2:
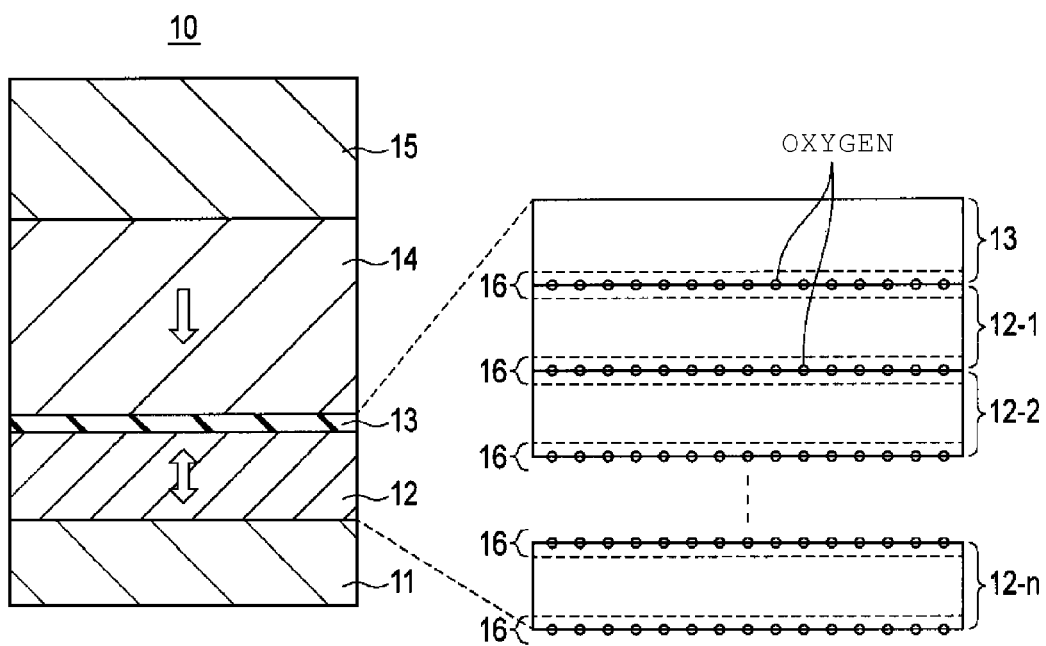
FIG. 2 is a cross-sectional view which illustrates another configuration example of a memory layer.

FIG. 2 illustrates another configuration example of the memory layer 12. The memory layer 12 is laminated with n magnetic layers 12-1 to 12-n. Here, n is a natural number of two or more. Each of the magnetic layers 12-1 to 12-n is configured with an alloy including cobalt (Co) and iron (Fe), e.g., CoFeB.

A plurality of oxygen atoms are inserted into an interface between the uppermost magnetic layer 12-1 and the tunnel barrier layer 13, and an interface between the lowermost magnetic layer 12-n and the base layer 11. Similarly, a plurality of oxygen atoms are inserted into each of the interfaces of the magnetic layers 12-1 to 12-n. In addition, when the tunnel barrier layer 13 is configured with an oxide, since the oxygen atoms configuring the tunnel barrier layer 13 are present on the interface between the tunnel barrier layer 13 and the magnetic layer 12-1, it is not necessary to newly insert oxygen atoms into the interface between the tunnel barrier layer 13 and the magnetic layer 12-1. Similarly, when the base layer 11 is configured with a non-magnetic layer including oxygen atoms, since the oxygen atoms configuring the base layer 11 are present on the interface between the magnetic layer 12-n and the base layer 11, it is not necessary to newly insert oxygen atoms into the interface between the magnetic layer 12-n and the base layer 11.

When the configuration in FIG. 2 is expressed in other words, the layer 16 including oxygen atoms is provided on the interface between the magnetic layer 12-1 and the tunnel barrier layer 13, the interfaces of the magnetic layers 12-1 to 12-n, and the interface between the magnetic layer 12-n and the base layer 11. The layer 16 including the oxygen atoms is configured with CoFeB and oxygen atoms which are main components.

Figure 3:
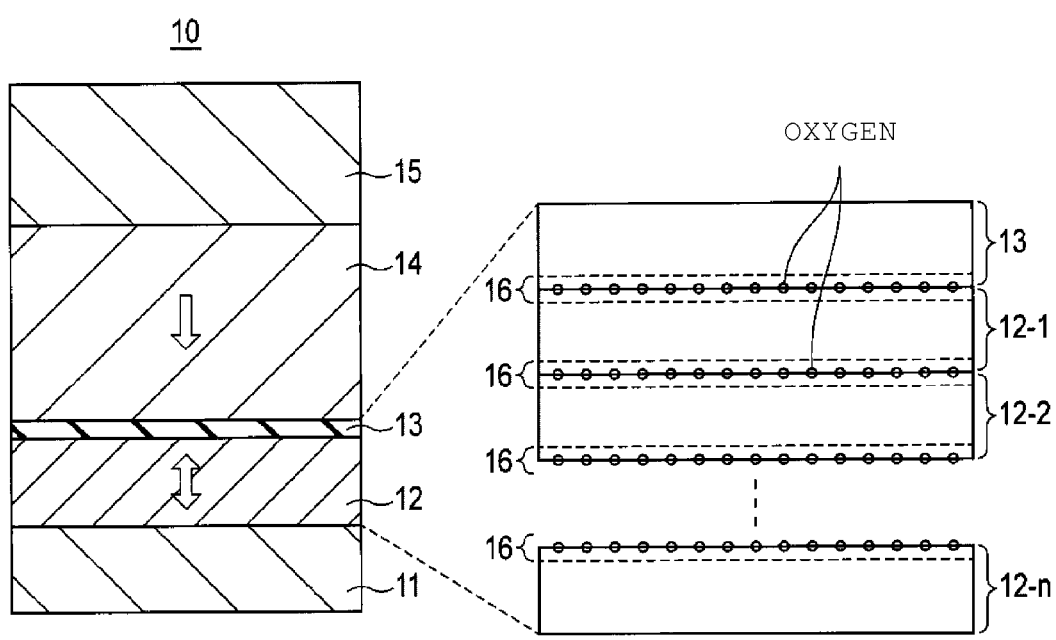
FIG. 3 is a cross-sectional view which illustrates still another configuration example of the memory layer.

FIG. 3 is yet another configuration example of the memory layer 12. A case in which the oxygen atoms are inserted into the interface between the magnetic layer 12-n and the base layer 11 may not be preferable depending on a material of the base layer 11, or a manufacturing process of the MTJ element 10. In the configuration example shown in FIG. 3, the oxygen atoms are not inserted into the interface between the magnetic layer 12-n and the base layer 11. Further, in the configuration in FIG. 3, since the oxygen atoms are inserted into at least each of the interfaces of the magnetic layers 12-1 to 12-n, and the perpendicular magnetic anisotropy is induced on the plurality of interfaces, it is possible to increase the perpendicular magnetic anisotropy energy of the memory layer 12. Other configurations than that in FIG. 3 are the same as those in FIG. 2.

Figure 4A:
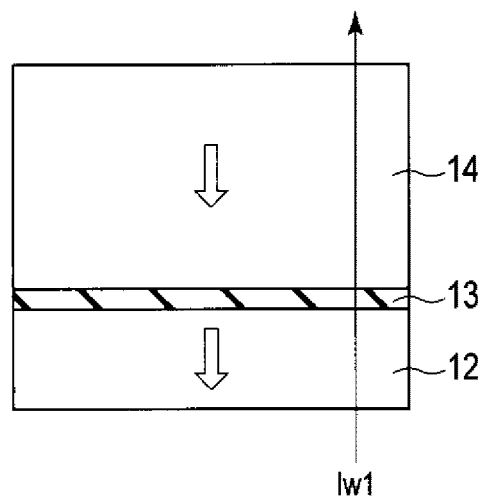
FIGS. 4A and 4B are diagrams which illustrate a relationship between a resistance state and a write current of the MTJ element.
Figure 4B:
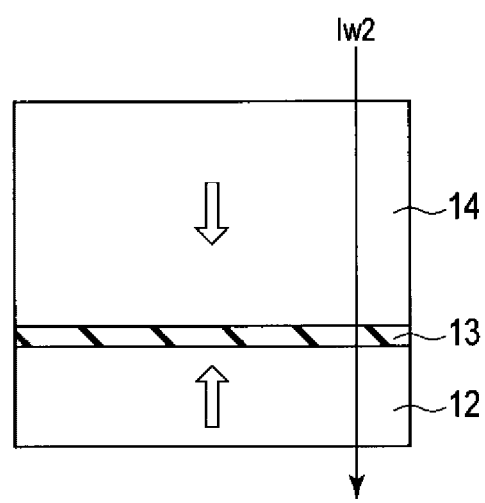

According to embodiments, a spin injection writing method in which a write current directly flows to the MTJ element 10, and a magnetized state of the MTJ element 10 is controlled due to the write current is adopted. The MTJ element 10 is able to adopt either a low resistance state or a high resistance state depending on whether a relative relationship in magnetization between the memory layer 12 and the reference layer 14 is parallel or anti-parallel. FIGS. 4A and 4B are diagrams which illustrate a relationship between a resistance state of the MTJ element 10 and the write current.

As illustrated in FIG. 4A, when a write current Iw1 flows toward the reference layer 14 from the memory layer 12 with respect to the MTJ element 10, the relative relationship in magnetization between the memory layer 12 and the reference layer 14 becomes parallel. In a case of the parallel state, a resistance value of the MTJ element 10 becomes the lowest, and the MTJ element 10 is set to a low resistance state. The low resistance state of the MTJ element 10 is defined as data "0", for example.

As illustrated in FIG. 4B, when a write current Iw2 flows toward the memory layer 12 from the reference layer 14 with respect to the MTJ element 10, the relative relationship in magnetization between the memory layer 12 and the reference layer 14 becomes anti-parallel. In a case of the anti-parallel state, a resistance value of the MTJ element 10 becomes the highest, and the MTJ element 10 is set to a high resistance state. The high resistance state of the MTJ element 10 is defined as data "1", for example.

In this manner, it is possible to use the MTJ element 10 as a memory element which is able to store 1 bit data (binary data). Allocation of the resistance state and the data of the MTJ element 10 can be arbitrarily set.

When data is read out from the MTJ element 10, a read voltage is applied to the MTJ element 10, and the resistance value of the MTJ element 10 is detected based on a read current which flows to the MTJ element 10 at this time. The read voltage is set to a sufficiently smaller value than a threshold value at which the memory layer 12 is reversely magnetized due to spin injection.

As described above, according to the first embodiment, the MTJ element (magnetic memory element) 10 is laminated with the memory layer 12, the tunnel barrier layer 13, and the reference layer 14, and the memory layer 12 is configured with the alloy including cobalt (Co) and iron (Fe). In addition, the plurality of oxygen atoms are inserted into the interface between the tunnel barrier layer 13 and the memory layer 12, and the main surface of the memory layer 12 on the opposite side to the tunnel barrier layer 13. Alternatively, the memory layer 12 is laminated with the plurality of magnetic layers 12-1 to 12-$n$, and each of the plurality of magnetic layers 12-1 to 12-$n$ is configured of the alloy including cobalt (Co) and iron (Fe). In addition, the plurality of oxygen atoms are inserted into the interface between the tunnel barrier layer 13 and the memory layer 12, and the interfaces of the plurality of magnetic layers 12-1 to 12-$n$.

Accordingly, according to the first embodiment, the perpendicular magnetic anisotropy is induced on both the interfaces of the memory layer 12, and/or on the interfaces of the plurality of magnetic layers which configure the memory layer 12. In this manner, even when the memory layer 12 is minimized, it is possible to secure a sufficient thermal disturbance constant in order to make the memory layer 12 stably retain information for a long period of time. As a result, the MTJ element 10 is able to stably retain information for a long period of time.

In addition, the perpendicular magnetic anisotropy is increased in proportion to the number of interfaces into which the oxygen atoms are inserted. In this manner, it is possible to make the thermal disturbance constant of the memory layer 12 larger by configuring the memory layer 12 to be laminated with the plurality of magnetic layers.

In addition, according to the above described embodiment, a configuration example for increasing the perpendicular magnetic anisotropy energy of the memory layer 12 is illustrated; however, it is also possible to apply the structure of the memory layer 12 to the reference layer 14. That is, it is possible to configure the MTJ element 10 such that the oxygen atoms are present on both the interfaces of the magnetic layer with respect to one side, or both sides of the memory layer 12 and the reference layer 14.

Second Embodiment

According to a second embodiment, a memory layer 12 (or magnetic layer included in memory layer 12) is configured by a columnar structure, or a granular structure.

Figure 5:
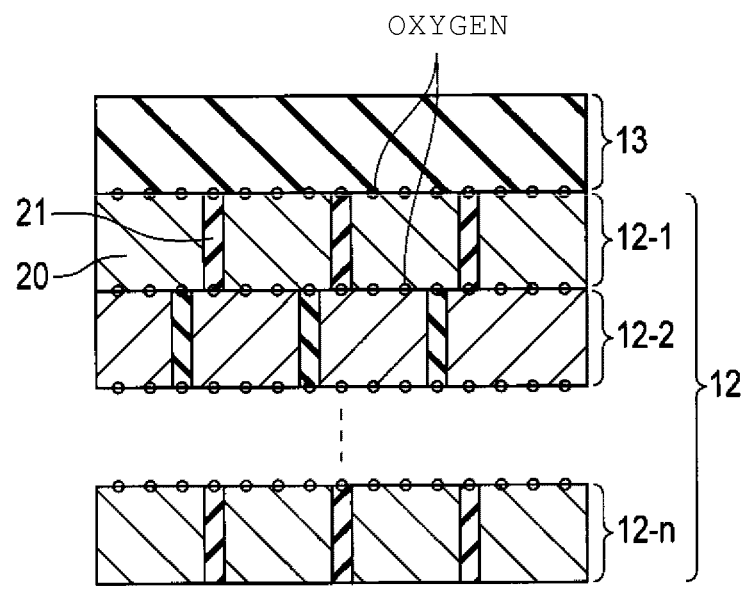
FIG. 5 is a cross-sectional view of a memory layer according to a second embodiment.

FIG. 5 is a cross-sectional view of the memory layer 12 according to the second embodiment. FIG. 5 illustrates only the memory layer 12 and a tunnel barrier layer 13. Configurations of layers other than the memory layer 12 and the tunnel barrier layer 13 are not illustrated in FIG. 5 and are the same as those in the first embodiment.

The memory layer 12 is laminated with n layers of magnetic layers 12-1 to 12-$n$. Each of the magnetic layers 12-1 to 12-$n$ includes the columnar structure. That is, each of the magnetic layers 12-1 to 12-$n$ is configured such that a plurality of magnetic portions 21 grow into the columnar shape within an insulation portion (non-magnetic portion) 20. Each of the plurality of magnetic portions 21 is configured with an alloy including cobalt (Co) and iron (Fe), e.g., CoFeB. The insulation portion 20 is configured with silicon oxide ($SiO_2$), for example.

In addition, similarly to the first embodiment, a plurality of oxygen atoms are inserted into an interface between the magnetic layer 12-1 and the tunnel barrier layer 13, and between each of the interfaces of the magnetic layers 12-1 to 12-$n$. It is possible to obtain the same effect as the first embodiment, even when the memory layer 12 is configured in this manner.

Figure 6:
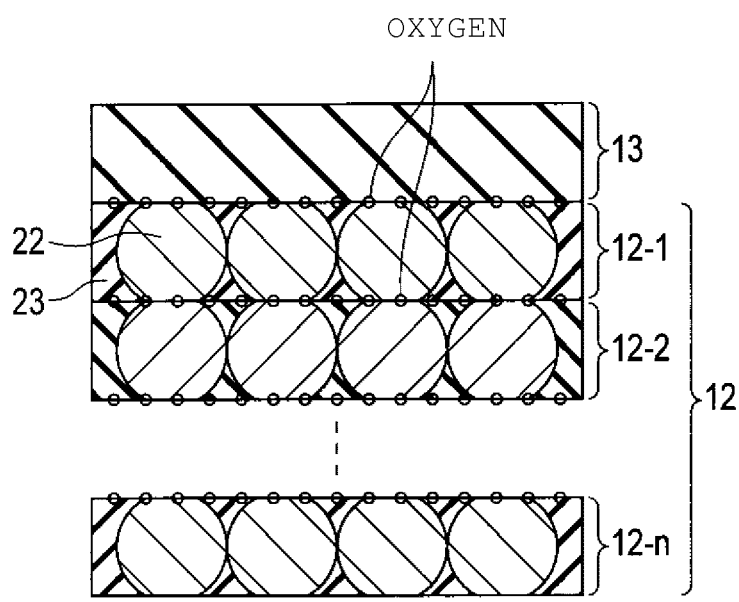
FIG. 6 is a cross-sectional view which illustrates another configuration example of the memory layer.

FIG. 6 is another configuration example of the memory layer 12. The memory layer 12 is laminated with n layers of magnetic layers 12-1 to 12-$n$. Each of the magnetic layers 12-1 to 12-$n$ has a granular structure. That is, each of the magnetic layers 12-1 to 12-$n$ is configured such that a plurality of magnetic portions 22 grow into the granular shape within an insulation portion (non-magnetic portion) 23. Each of the plurality of magnetic portions 22 is configured with an alloy including cobalt (Co) and iron (Fe), e.g., CoFeB. The insulation portion 23 is configured with silicon oxide ($SiO_2$), for example.

In addition, similarly to the first embodiment, a plurality of oxygen atoms are inserted into an interface between the magnetic layer 12-1 and the tunnel barrier layer 13, and between each of the interfaces of the magnetic layers 12-1 to 12-$n$. It is possible to obtain the same effect as the first embodiment, even when the memory layer 12 is configured in this manner.

In addition, as in FIG. 2 according to the first embodiment, the plurality of oxygen atoms may be inserted into the interface between the magnetic layer 12-$n$ and a base layer 11. In addition, similarly to FIG. 1 according to the first embodiment, the memory layer 12 may be configured by a single magnetic layer. In such a case, the memory layer 12 is configured by a single magnetic layer having a columnar shape, or a granular shape. In addition, the structure of the memory layer 12 according to the embodiment may be applied to the reference layer 14.

Third Embodiment

A third embodiment is a configuration example when configuring an MRAM (magnetic memory) using the above described MTJ element 10. As the MTJ element 10, it is possible to use any one of MTJ elements of the first and second embodiments.

Figure 7:
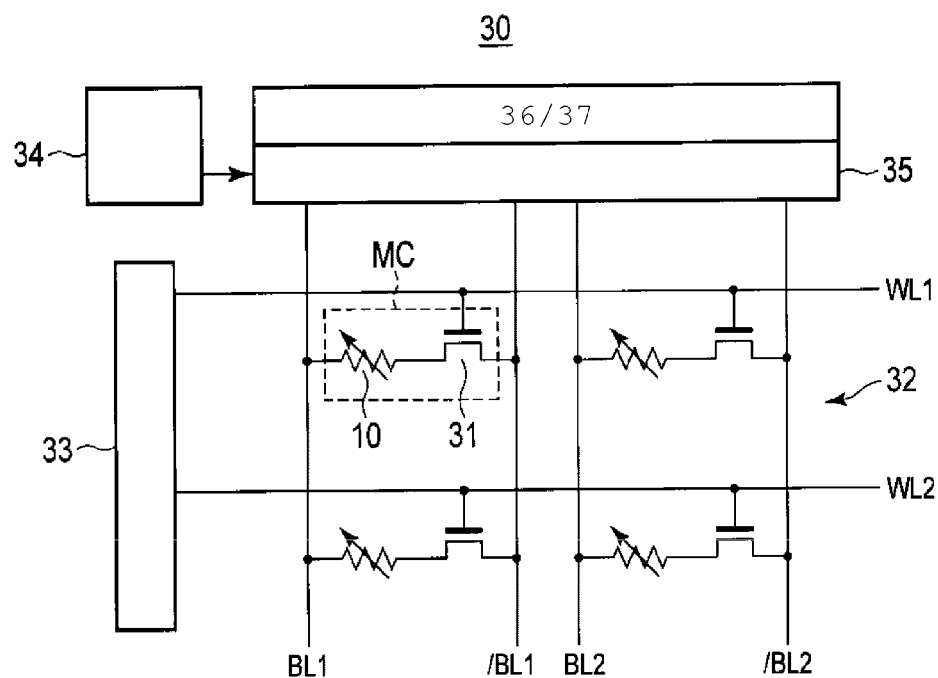
FIG. 7 is a circuit diagram of an MRAM according to a third embodiment.

FIG. 7 is a circuit diagram of an MRAM 30 according to the third embodiment. The MRAM 30 includes a memory cell array 32 including a plurality of memory cells MC which are arranged in a matrix. In addition, FIG. 7 illustrates the memory cells MC of 2×2 as an example. A plurality of pairs of bit lines BL and /BL are arranged in the memory cell array 32 so that each of the bit lines is extended in the column direction. In addition, a plurality of word lines WL are arranged in the memory cell array 32 so that each of the word lines is extended in the row direction.

The memory cells MC are arranged in regions in which the bit line and the word line cross. Each of the memory cells MC includes the MTJ element 10, and a selection transistor 31. As the selection transistor 31, for example, an N channel Metal Oxide Semiconductor Field Effect Transistor (MOSFET) is used. One end of the MTJ element 10 is connected to the bit line BL. The other end of the MTJ element 10 is connected to a drain of the selection transistor 31. A gate of the selection transistor 31 is connected to the word line WL. A source of the selection transistor 31 is connected to the bit line /BL.

A row decoder 33 is connected to the word line WL. A row decoder 33 selects any one of the plurality of word lines WL based on a row address.

A write circuit 36 and a read circuit 37 are connected to a pair of bit lines BL and /BL through a column selection circuit 35. The column selection circuit 35 includes, for example, the N channel MOSFET in the number corresponding to all of bit lines, and selects the pair of bit lines BL and /BL which is necessary for an operation according to an instruction of a column decoder 34. The column decoder 34 decodes a column address, and sends a decoded signal to the column selection circuit 35.

The write circuit 36 receives write data from the outside. The write circuit 36 applies a write voltage to the pair of bit lines BL and /BL which is connected to a selected memory cell as a write target. In addition, data is written in the selected memory cell by making the write current flow to the selected memory cell through the pair of bit lines BL and /BL.

The read circuit 37 applies a read voltage to the pair of bit lines BL and /BL which is connected to a selected memory cell as a read target. In addition, data which is stored in the selected memory cell is detected based on the read current which flows to the selected memory cell. The data which is read out by the read circuit 37 is output to the outside.

Writing of data in the memory cell MC is performed as follows. First, in order to select a memory cell MC at which data writing is performed, a word line WL which is connected to a memory cell MC to be selected is activated by the row decoder 33. In this manner, the selection transistor 31 is turned on. In addition, a pair of bit lines BL and /BL which is connected to the selected memory cell MC is selected by the column decoder 34.

Here, one of write currents on both sides is supplied to the MTJ element 10 according to write data. Specifically, when the write current is supplied to the MTJ element 10 from the left to the right in the figure, the write circuit 36 applies a positive voltage to the bit line BL, and applies a ground voltage to the bit line /BL. In addition, when the write current is supplied to the MTJ element 10 from the right to the left in the figure, the write circuit 36 applies a positive voltage to the bit line /BL, and applies a ground voltage to the bit line BL. In this manner, it is possible to write data "0", or data "1" in the memory cell MC.

Subsequently, reading of data from the memory cell MC is performed as follows. First, similarly to the case of writing, the selection transistor 31 of the selected memory cell MC is turned on. The read circuit 37 supplies a read current which flows from the right to the left in the figure to the MTJ element 10, for example. The read current is set to be a sufficiently smaller value than a threshold value at which there is reverse magnetized due to spin injection. In addition, the read circuit 37 detects a resistance value of the MTJ element 10 based on the read current. In this manner, it is possible to read data which is stored in the MTJ element 10.

Figure 8:
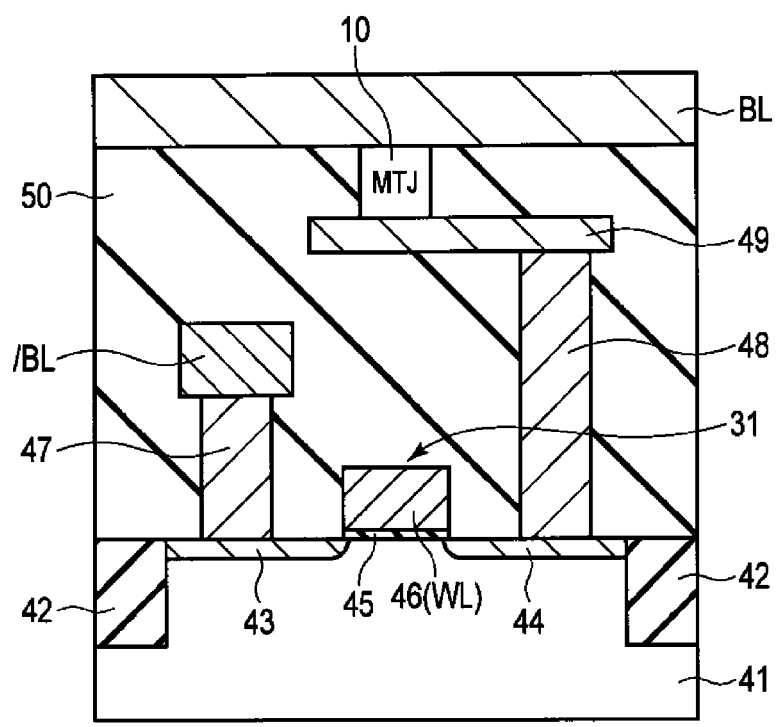
FIG. 8 is a cross-sectional view of the MRAM.

Subsequently, a structure example of the MRAM 30 will be described. FIG. 8 is a cross-sectional view of the MRAM 30. An element isolation insulating layer 42 of a shallow trench isolation (STI) structure is provided in a P-type semiconductor substrate 41. The N-channel MOSFET as the selection transistor 31 is provided in an element region (active region) which is surrounded with the element isolation insulating layer 42. The selection transistor 31 includes a source region 43 and a drain region 44 which are separately formed in the element region, a gate insulation film 45 which is provided on a channel region between the source region 43 and the drain region 44, and a gate electrode 46 which is provided on the gate insulation film 45. The gate electrode 46 functions as the word line WL which is illustrated in FIG. 7. The source region 43 and the drain region 44 are formed in an N-type diffusion region, respectively.

A contact plug 47 is provided on the source region 43. The bit line /BL is provided on the contact plug 47. A contact plug 48 is provided on the drain region 44. An extraction electrode 49 is provided on the contact plug 48. The MTJ element 10 is provided on the extraction electrode 49. The bit line BL is provided on the MTJ element 10. An interlayer insulation layer 50 is filled between the semiconductor substrate 41 and the bit line BL.

As described above, according to the third embodiment, it is possible to configure the MRAM 30 using any of the MTJ elements 10 which are described in the first and second embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetic memory element comprising:
  a memory layer having magnetic anisotropy on a film surface thereof in a perpendicular direction and in which a magnetization direction is variable;
  a reference layer having magnetic anisotropy on the film surface thereof in the perpendicular direction and in which the magnetization direction is fixed; and
  a tunnel barrier layer interposed between the memory layer and the reference layer,
  wherein the memory layer is made of an alloy including cobalt (Co) and iron (Fe),
  wherein a plurality of oxygen atoms are present in an interface between the tunnel barrier layer and the memory layer, and on a surface of the memory layer opposite to the tunnel barrier layer; and
  wherein the memory layer includes a plurality of magnetic layers and a plurality of oxygen atoms are present at interfaces between each of the magnetic layers, and a concentration of oxygen is higher at each of the interfaces between the magnetic layers of the memory layer than a concentration of oxygen within each of the magnetic layers of the memory layer.
2. The magnetic memory element according to claim 1, wherein the tunnel barrier layer is made of an oxide.

3. The magnetic memory element according to claim 2, wherein the tunnel barrier layer is made of magnesium oxide.

4. The magnetic memory element according to claim 3, wherein the plurality of oxygen atoms are present in the interface between the tunnel barrier layer and the memory layer in higher concentration than in the tunnel barrier layer.

5. The magnetic memory element according to claim 1, further comprising a base layer contacting the surface of the memory layer opposite to the tunnel barrier layer.

6. The magnetic memory element according to claim 5, wherein the base layer is made of nonmagnetic material comprising oxide.

7. The magnetic memory element according to claim 6, wherein the plurality of oxygen atoms are present in the interface between the base layer and the memory layer in higher concentration than in the base layer.

8. The magnetic memory element according to claim 1, wherein the tunnel barrier layer is made of magnesium oxide.

9. The magnetic memory element according to claim 1, wherein each magnetic layer of the memory layer includes magnetic portions formed as columns that extend between adjoining magnetic layers within a nonmagnetic portion that extends between the adjoining magnetic layers.

10. The magnetic memory element according to claim 1, wherein each magnetic layer of the memory layer includes magnetic portions formed in a granular structure that extends between adjoining magnetic layers within a nonmagnetic portion that extends between the adjoining magnetic layers.

11. A magnetic memory element comprising:
a memory layer having a magnetization direction that is variable;
a reference layer having a magnetization direction that is fixed; and
a tunnel barrier layer interposed between the memory layer and the reference layer,
wherein the memory layer includes a plurality of magnetic layers, each of which is made of an alloy including cobalt (Co) and iron (Fe), and
wherein a plurality of oxygen atoms are present on an interface between the tunnel barrier layer and the memory layer, and on interfaces between each pair of the magnetic layers, and a concentration of oxygen is higher at each of the interfaces between the magnetic layers of the memory layer than a concentration of oxygen within each of the magnetic layers of the memory layer.

12. The magnetic memory element according to claim 11, further comprising a base layer contacting a surface of the memory layer opposite to the tunnel barrier layer.

13. The magnetic memory element according to claim 12, wherein a plurality of oxygen atoms are present on an interface between the base layer and the memory layer.

14. The magnetic memory element according to claim 13, wherein the tunnel barrier layer and the base layer are each made of nonmagnetic material comprising oxide.

15. The magnetic memory element according to claim 14, wherein the plurality of oxygen atoms are present in the interface between the base layer and the memory layer in higher concentration than in the base layer.

16. The magnetic memory element according to claim 11, wherein each magnetic layer of the memory layer includes magnetic portions formed as columns that extend between adjoining magnetic layers within a nonmagnetic portion that extends between the adjoining magnetic layers.

17. The magnetic memory element according to claim 11, wherein each magnetic layer of the memory layer includes magnetic portions formed in a granular structure that extends between adjoining magnetic layers within a nonmagnetic portion that extends between the adjoining magnetic layers.

18. A magnetic memory element comprising:
a memory layer made of an alloy including cobalt (Co) and iron (Fe), having magnetic anisotropy on a film surface thereof in a perpendicular direction and in which a magnetization direction is variable;
a reference layer having magnetic anisotropy on the film surface thereof in the perpendicular direction and in which the magnetization direction is fixed;
a tunnel barrier layer interposed between the memory layer and the reference layer; and
a base layer contacting the surface of the memory layer opposite to the tunnel barrier layer,
wherein a plurality of oxygen atoms are present in an interface between the tunnel barrier layer and the memory layer, and
wherein the memory layer includes magnetic portions formed in a columnar or granular structure that extend between the base layer and the tunnel barrier layer within a nonmagnetic portion that extends between the base layer and the tunnel barrier layer.

* * * * *